United States Patent
Galyaev

(10) Patent No.: US 11,089,672 B1
(45) Date of Patent: Aug. 10, 2021

(54) RADIATION BEAM WINDOW ASSEMBLY COMPRISING FIBER BOUND CORE PANELS AND METHODS FOR THE SAME

(71) Applicant: Radiation Detection and Imaging Technologies, LLC, Tempe, AZ (US)

(72) Inventor: Evgeny Galyaev, Phoenix, AZ (US)

(73) Assignee: Radiation Detection and Imaging Technologies, LLC, Tempe, AZ (US)

( * ) Notice: Subject to any disclaimer, the term of this patent is extended or adjusted under 35 U.S.C. 154(b) by 0 days.

(21) Appl. No.: 16/992,896

(22) Filed: Aug. 13, 2020

Related U.S. Application Data

(60) Provisional application No. 62/886,025, filed on Aug. 13, 2019.

(51) Int. Cl.
*H05K 1/02* (2006.01)

(52) U.S. Cl.
CPC ......... *H05K 1/0215* (2013.01); *H05K 1/0274* (2013.01); *H05K 2201/10121* (2013.01)

(58) Field of Classification Search
CPC ............... H01K 1/0215; H01K 1/0274; H05K 2201/10121
See application file for complete search history.

(56) References Cited

U.S. PATENT DOCUMENTS

| | | | | |
|---|---|---|---|---|
| 2002/0056560 | A1* | 5/2002 | Liu | B81B 7/0067 174/50.5 |
| 2004/0264884 | A1* | 12/2004 | Liu | G02B 6/4292 385/89 |
| 2006/0022213 | A1* | 2/2006 | Posamentier | H01S 5/02212 257/99 |
| 2013/0112896 | A1* | 5/2013 | Dubochet | H01K 1/14 250/504 R |
| 2014/0041214 | A1* | 2/2014 | Barlow | H01L 27/14625 29/841 |
| 2017/0238415 | A1* | 8/2017 | Kobayashi | G01V 8/12 361/748 |
| 2017/0353640 | A1* | 12/2017 | Wang | H01L 27/14625 |
| 2019/0179028 | A1* | 6/2019 | Pacala | G01S 17/89 |
| 2019/0235351 | A1* | 8/2019 | Lee | H01S 5/423 |
| 2020/0271873 | A1* | 8/2020 | Chang | H01L 23/5386 |

* cited by examiner

*Primary Examiner* — Hoa C Nguyen
(74) *Attorney, Agent, or Firm* — Booth Udall Fuller, PLC; Bryce W. Burnham

(57) ABSTRACT

A radiation beam window assembly may include a substrate and a spacer panel comprising a rigid low-density core with first and second fiber skins disposed on opposing surfaces of the foam core and a central opening disposed completely through the spacer panel and disposed over the substrate. A beam window panel may comprise a rigid low-density foam core comprising first and second fiber skins disposed on opposing surfaces of the foam core. The beam window panel may further include a cathode formed over the first fiber skin and aligned with the central opening of the spacer panel. A channel may be formed completely around a perimeter of the cathode, and the second fiber skin may comprise a ground ring. A pressure plate may be disposed over the beam window panel and mechanically coupled to the substrate, the pressure plate comprising a conductive layer configured to be electrically grounded with the ground ring.

20 Claims, 7 Drawing Sheets

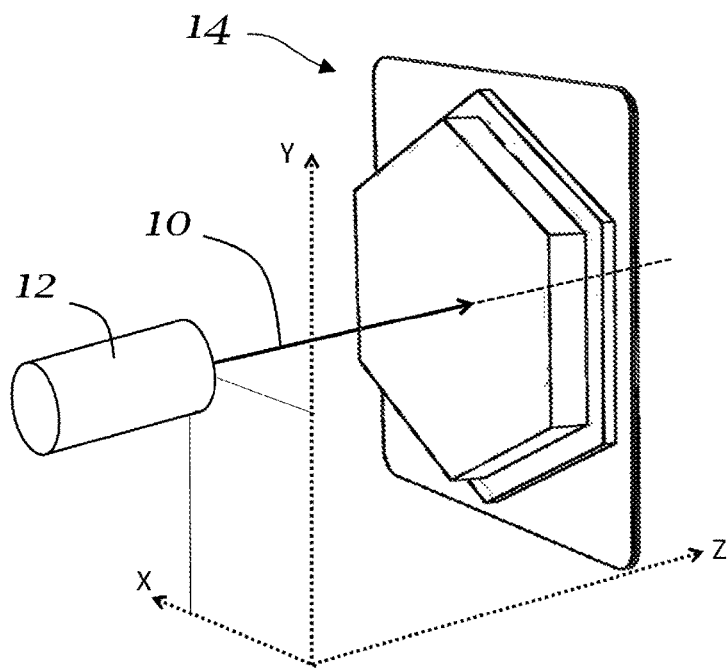
FIG. 1A—Prior Art
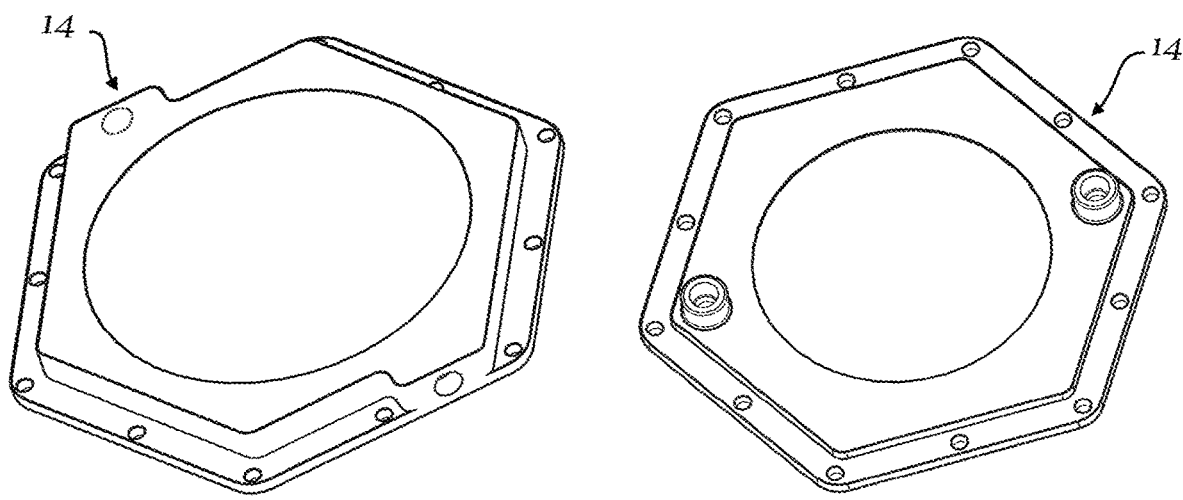
FIG. 1B—Prior Art
FIG. 1C—Prior Art

RADIATION BEAM WINDOW ASSEMBLY COMPRISING FIBER BOUND CORE PANELS AND METHODS FOR THE SAME

RELATED APPLICATIONS

This application claims the benefit of U.S. provisional patent application 62/886,025, filed Aug. 13, 2019 titled "Radiation Detector Comprising Carbon Fiber Foam Core Panel for Cathode and Beam Window and Methods for Same," the entirety of the disclosure of which is incorporated by this reference.

TECHNICAL FIELD

This disclosure relates to a radiation beam window assembly comprising fiber bound core panels and a radiation beam window cathode assembly comprising fiber bound core panels and methods for the same.

BACKGROUND

Particle detectors or beam detectors can be used to detect a passing particle or a stream of particles that comprise or form a "beam" of particles. The particle detectors may obtain information about the particle, such as its position, arrival time, and momentum. Particles can come from a particle accelerators, from space (such as a cosmic rays), from a nuclear reactor, or from any other suitable source. FIGS. 1A-1C show conventional beam detectors as known in the prior-art. FIG. 1A illustrates a perspective view of a radiation beam, ionizing particle beam, or incident beam of particles 10 being produced by, or emitted from, a radiation source 12 and being directed to a radiation detector 14. The radiation detector 14 can collect a signal from the radiation beam 10 such as with data acquisition electronics. FIG. 1A shows the radiation beam 10 travelling generally in a z-direction, and through the radiation detector 14, which is placed in and occupies an x-y-plane.

FIG. 1B shows a perspective view of a first surface of a housing of a conventional radiation detector 14, in which the housing may be hermetically sealed, and may be formed of an electrically conductive material, such as aluminum (Al), or other suitable material. FIG. 1C shows another perspective view of the housing of the conventional radiation detector 14, opposite the view shown in FIG. 1B.

SUMMARY

In an aspect, a radiation beam window assembly may comprise a printed circuit board (PCB) substrate comprising an upper first surface comprising a power array comprising an electrical ground, and electrical interconnects for one or more electronic devices selected from the group consisting of pressure sensors, temperature sensors, data acquisition devices, and communication devices. A spacer panel may comprise a rigid low-density foam core comprising a first carbon fiber skin disposed on a first surface of the foam core and a second carbon fiber skin disposed on a second surface of the foam core opposite the first surface of the foam core. The spacer panel may further comprise a central opening disposed completely through the spacer panel, the central opening comprising a footprint larger than a footprint of the electrical interconnects for one or more electronic devices formed on the PCB substrate. The spacer panel may be disposed over the upper first surface of the PCB substrate. A beam window panel may comprise a rigid low-density foam core comprising a first lower carbon fiber skin disposed on a first surface of the foam core and a second upper carbon fiber skin disposed on a second surface of the foam core opposite the first lower surface of the foam core. The beam window panel may further comprise a cathode formed on the first lower carbon fiber skin of the beam window panel as a conductive paint, foil, or sticker. A channel may be formed completely around a perimeter of the cathode with the channel extending completely through the first lower carbon fiber skin of the beam window panel. The second upper carbon fiber skin may be coupled to a conductive ground ring disposed over the second upper carbon fiber skin and configured to electrically ground the second upper carbon fiber skin of the beam window panel. The beam window panel may be disposed over the PCB substrate and over the spacer panel with the cathode aligned with the central opening of the spacer panel and oriented towards the upper first surface of the PCB substrate. A pressure plate may be disposed over the PCB substrate with the spacer panel and the beam window panel disposed between the PCB substrate and the pressure plate. The pressure plate may further comprise a conductive layer formed on a lower surface of the pressure plate, the conductive layer configured to be in electrical contact with the conductive ground ring of the beam window panel. The pressure plate may be coupled to the PCB substrate with a plurality of mechanical fasteners that extend through the PCB substrate, the spacer panel, the beam window panel, and the pressure plate. A conductive spring may extend between and be coupled to the electrical ground of the upper first surface of the PCB substrate and the lower surface of the pressure plate such that the beam window panel is grounded by, and electrically coupled through, the conductive layer formed on the lower surface of the pressure plate and the conductive ground ring of the second upper carbon fiber skin of the beam window panel.

The radiation beam window assembly may further comprise the central opening of the spacer panel being bounded by the PCB substrate and the beam window panel to form an internal enclosure, the internal enclosure configures as an air field, a gas chamber, or a gas boundary. The mechanical stability of the PCB substrate, the spacer panel, the beam window panel, and the pressure plate limit vertical deformation from bending between the PCB substrate and the cathode to less than 0.1%, to substantially maintain an offset between the PCB substrate and the cathode. The carbon fiber skins of the spacer panel and the beam window panel may comprise a thickness in a range of 0.2-0.8 mm. The channel may be formed completely around a perimeter of the cathode and comprise a width of 4-6 mm and insulate against a voltage bias of at least 3 KV between the cathode and the carbon fiber skin of the beam window panel separated from the cathode by the channel. The conductive ground ring may be formed with a conductive sticky copper tape disposed in a hexagonal groove comprising a depth greater than 15 micrometers that extends completely through an epoxy surface disposed over the carbon fiber of the second upper carbon fiber skin such that the conductive ground ring is in electrical contact with the carbon fiber of the second upper carbon fiber skin.

In another aspect, a radiation beam window assembly may comprise a substrate comprising a first surface comprising electrical interconnects for one or more electronic devices. A spacer panel may comprise a central opening disposed completely through the spacer panel and disposed over the first surface of the substrate. A beam window panel may comprise a foam core comprising a first fiber skin disposed on a first surface of the foam core and a second fiber skin disposed opposite the first surface. The beam window panel may further comprise a cathode formed over the first fiber skin and aligned with the central opening of the spacer panel and the first surface of the substrate. A channel may be formed completely around a perimeter of the cathode with the channel extending completely through the first fiber skin of the beam window panel. The second fiber skin may comprise a ground ring configured to be electrically grounded. A pressure plate may be disposed over the beam window panel and mechanically coupled to the substrate, the pressure plate comprising a conductive layer configured to be electrically grounded with the ground ring.

The radiation beam window assembly may further comprise a conductive spring comprising a first end coupled to the first surface of the substrate and a second end coupled to the pressure plate such that the beam window panel is grounded by, and electrically coupled through, the conductive spring. The spacer panel may further comprise a foam core comprising a first fiber skin disposed on a first surface of the foam core and a second fiber skin disposed opposite the first surface of the foam core. The spacer panel may comprise a solid metal flange. The fiber skins of the spacer panel and the beam window panel may comprise a thickness in a range of 0.2-0.3 mm. The channel may be formed completely around a perimeter of the cathode comprising a width of 4-6 mm and insulate against a voltage bias of at least 3 KV between the cathode and the fiber skin of the beam window assembly separated from the cathode by the channel. The conductive ground ring may be formed with a conductive material disposed in a groove that extends completely through an epoxy surface disposed over the fiber of the second fiber skin such that the conductive ground ring is in electrical contact with the fiber of the second fiber skin.

In yet another aspect, a radiation beam window assembly may comprise a substrate comprising a first surface configured to receive one or more electronic devices. A beam window panel may comprise a core, a first skin disposed on a first surface of the core, and a second skin disposed opposite the first surface. The beam window panel may further comprise a beam window. A channel may be formed completely around a perimeter of the beam window with the channel extending completely through the first skin of the beam window panel. A ground ring may be configured to be electrically ground and to electrically isolate the second skin of the beam window panel from the beam window.

The radiation beam window assembly may further comprise a spacer panel comprising a core, a first fiber skin disposed on a first surface of the foam core, and a second fiber skin disposed opposite the first surface of the foam core, the spacer panel further comprising a central opening disposed completely through the spacer panel and positioned over the first surface of the substrate. A cathode may be formed over the first skin of the beam window panel and aligned with the first surface of the substrate. A conductive interconnect may comprise a first end coupled to the first surface of the substrate and a second end configured to be electrically coupled to the cathode to electrically ground the substrate and the second skin of the beam window panel from the cathode.

A pressure plate may be disposed over the beam window panel and mechanically coupled to the substrate, the pressure plate comprising a conductive layer configured to be electrically grounded with the conductive interconnect. The substrate, spacer panel, beam window panel, and pressure plate may be coupled with a plurality of mechanical fasteners. The channel may be formed completely around a perimeter of the cathode and comprise a width of 2-8 mm and insulate against a voltage bias of at least 3 KV between the cathode and the first skin of the beam window assembly separated from the cathode by the channel. The conductive ground ring may be formed with a conductive material disposed in a groove that extends completely through an epoxy surface disposed over a conductive portion of the second skin such that the conductive ground ring is in electrical contact with the conductive portion of the second skin.

Aspects and applications of the disclosure presented here are described below in the drawings and detailed description. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

FIGS. 1A-1C show conventional beam detectors as known in the art.

DETAILED DESCRIPTION

Figure 2A:
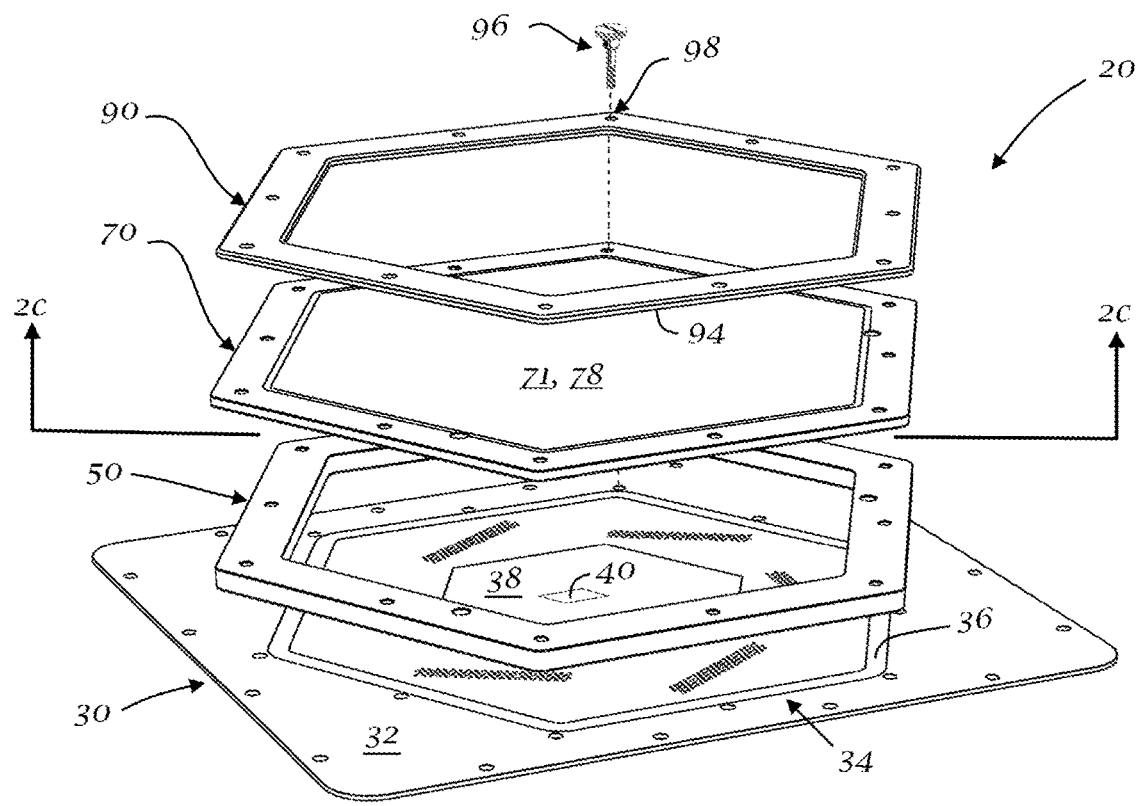
FIGS. 2A-2C show various views of an aspect of a beam window assembly.

This disclosure relates to a particle detector, and more specifically to a beam window assembly. Particle detectors can be used to detect a passing particle and to obtain information about the particle, such as its position, arrival time, and momentum. The particle can come from a particle accelerator, from space (such as a cosmic ray), from a nuclear reactor, or from any other suitable source. Particle detectors include Micromegas and Segmented Wire Ion Chambers (SWICs), which may benefit from the disclosure presented herein, multi-wire ion chambers, parallel-plate ionization chambers, time projection chambers, planar ionization chamber arrays, as well as other types of detectors and other assemblies comprising a beam window or cathode beam window as part of a detector containment enclosure through which radiation enters the detector device. Furthermore, while the term cathode is used herein for convenience, relative charge or a cathode and anode may be interchanged based on a desired configuration and design of the detector device or beam window assembly. It is intended that the concepts and principles further explained in this disclosure will be applied to the disclosures of the above referenced application by those of ordinary skill in the art.

This disclosure, its aspects and implementations, are not limited to the specific package types, material types, or other system component examples, or methods disclosed herein. Many additional components, manufacturing procedures, and assembly procedures known in the art consistent with semiconductor manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation. For example, while the discussion makes emphasis on proton therapy in particular, the proposed design could be adapted for other particle types, and used in a wide variety of applications in both science and industry.

As used herein, the terms "about," "substantially," and "approximately" means within a percent difference of 40% or less, 30% or less, 20% or less, 10% or less, 5% or less, 3% or less, 1% or less. The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Figure 2B:
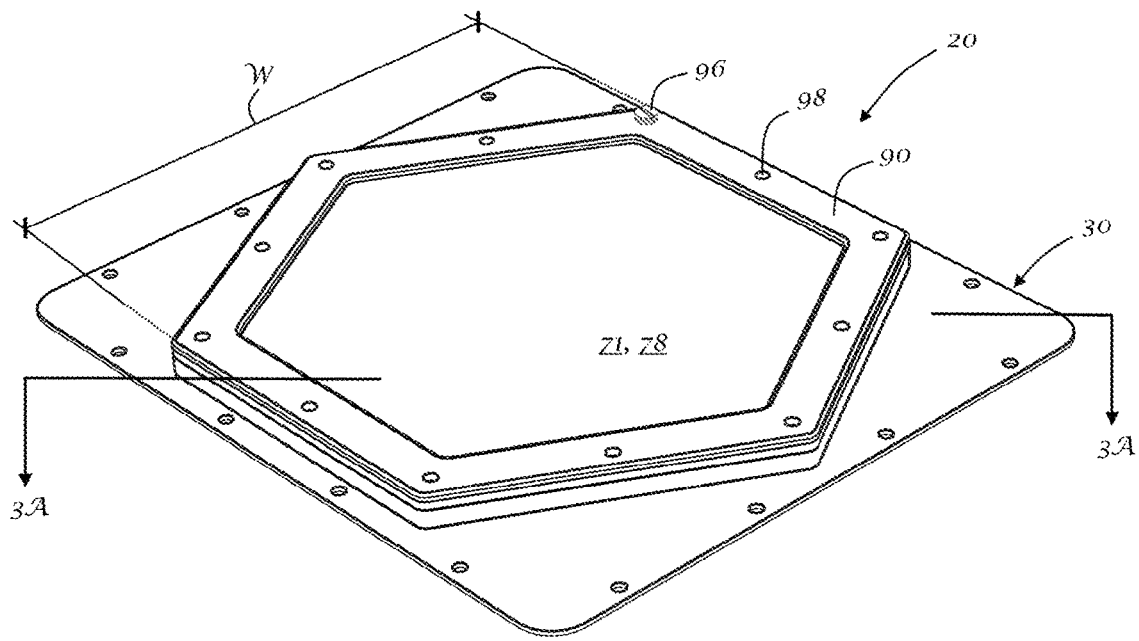
Figure 2C:
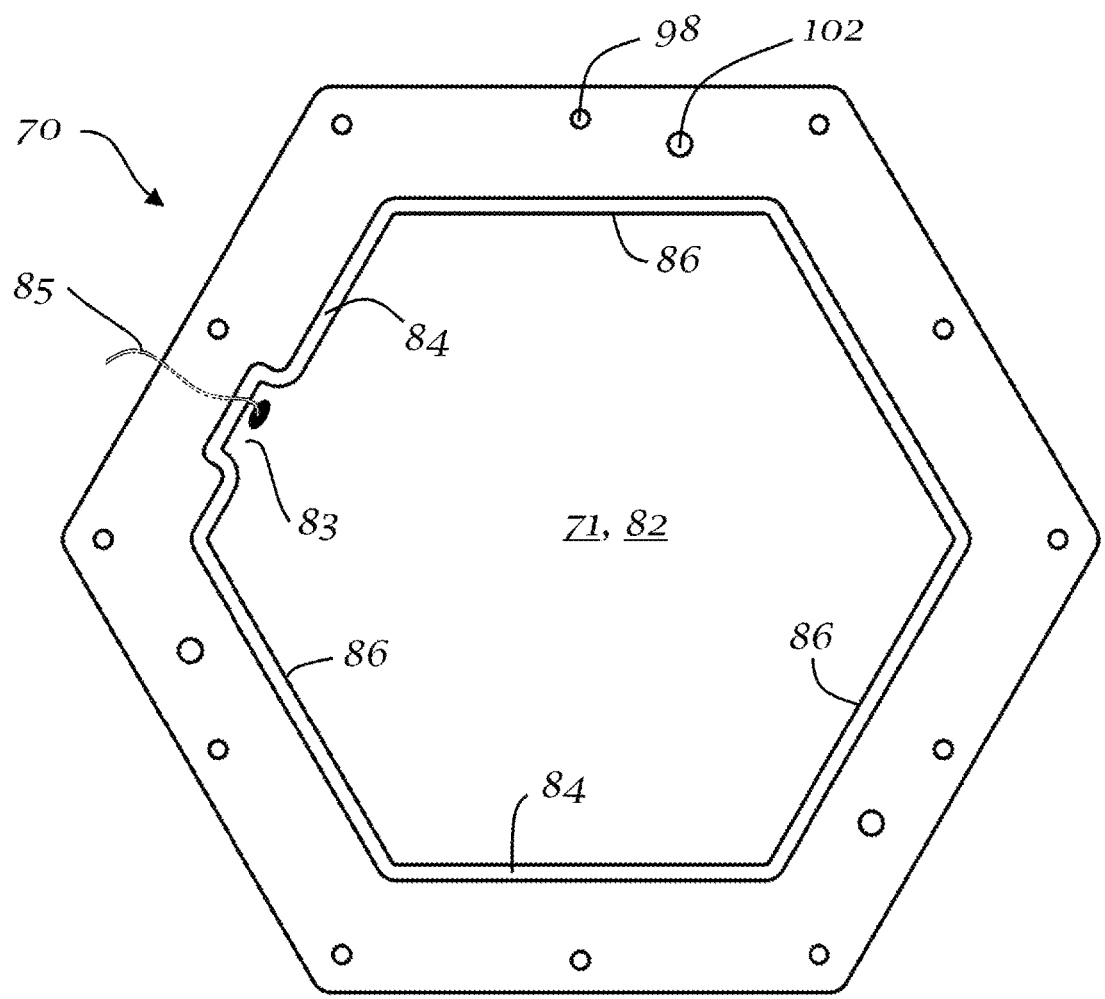

FIGS. 2A-2C show various views of an aspect of a radiation beam window assembly or cathode assembly 20. FIG. 2A shows an exploded perspective view of the beam window assembly 20 comprising a PCB substrate or substrate 30 comprising an upper first surface 32 comprising a power array 34 comprising an electrical ground 36, and electrical interconnects 38 for one or more electronic devices 40 selected from the group consisting of pressure sensors, temperature sensors, data acquisition devices, and communication devices. The PCB substrate 30 may be made of any suitable material, including FR4 (a NEMA grade designation for glass-reinforced epoxy laminate material), KAPTON (a polyimide film developed by DuPont, or other similar or suitable materials that have high resistance to degradation by radiation exposure). In some instances, the substrate 30 may be coupled to a pressure plate similar to and opposite pressure plate 90. By forming the housing or spacer panel 50 and the beam window panel or cathode panel or 70 with non-conductive materials or insulated materials, the exterior of the beam window assembly can be non-conductive, unlike conventional radiation detectors 14, that are conventionally aluminum or electrically conductive materials.

The beam window assembly 20 may further comprise a spacer panel 50 comprising a rigid low-density foam core 52 comprising a first carbon fiber skin 54 disposed on a first surface 56 of the foam core 52 and a second carbon fiber skin 58 disposed on a second surface 60 of the foam core opposite the first surface 56 of the foam core 52. The inclusion of the core 52 (similar to core 72 discussed below) may comprise foam, which is provided by way of illustration and not by way of limitation, and a person of ordinary skill in the art (POSA) will understand other low-density materials (please provide numerical range of what qualifies as low-density xxx-xxx) such as plastics or other rigid materials with high transparency to radiation may also be used. As a non-limiting example, Airloy® (a trademark of Aerogel Technologies, LLC) is an example of a low-density and rigid plastic. Other materials for core 52, 72, include, without limitation, open cell foam, closed cell foam, balsa wood, cellulose, fibrous or organic material, ROHACELL® HF, closed-cell rigid polymethacrylimide (PMI), Gurit Corecell A (500), Divinycell, 3A AIRLEX, or other suitable material. As used herein with respect to the cores 52, 72, "rigid" means a Compressive Yield Strength greater than 0.5 mPa, and Ultimate Strength>20 mPa, and a Tensile Strength>0.5 mPa (as determined by the ASTM C273 test method), with a strength-to-weight ratio greater than or equal to 10,000:1. As used herein with respect to the cores 52, 72, "low density" means densities less than 1.0 g/cc or less than 0.5 g/cc. Examples include Airloy plastic by Aerogel Technologies, LLC and similar (such as the Gurit Corecell family of products) that comprise densities as low as about 0.01 g/cc. In some instances, fine-cell materials can be processed by hand lay-up, prepreg, or vacuum infusion techniques at pressures up to 0.3 MPa and temperatures up to 130° C.

Core materials 52, 72 may be used in conjunction with carbon fiber sheet skins or on their own without skins to form beam window 71. They may also be used with metallization/conductive coating, to form cathode 82. By sandwiching the core material between very thin skins, including fiber skins or sheets with high tensile strength, like carbon fiber sheets, the composite panels 50, 70 will be strong and light, while remaining transparent or substantially transparent to radiation.

The spacer panel or element 50 (whether a composite panel or not), and the beam window panel or element 70 may be configured as, or function as, supporting structures that also maintain a constant defined distance 112. The constant defined distance 112 may be between the beam window 71 and the substrate 30. The constant defined distance 112 may (in the event that the beam window 71 is also a cathode 82) be between the beam window 71 and the substrate 30 or an anode formed on or over the substrate 30, such as the anode being formed as part of the electrical interconnects 38 or electronic devices 40. The spacer panel or element 50, and the beam window panel or element 70 may be made of various materials or include various structures or features, such as separate stand-off pillars, columns, posts, studs, offsets, or other supporting structures or features for maintaining the beam window 71 or cathode 82 positioned firmly above the anode or another detector sensing surface or electronic device 40.

In some instances, the beam window assembly 20 may further comprise a spacer panel 50 formed as a solid metal flange, such as aluminum, steel, brass, or other suitable material, when a large beam window 71 is present, such as when a beam window 71 comprises a width of about 20 cm, 30 cm, 40 cm, or more, to result in additional rigidity when additional rigidity is desired or required of the beam window assembly 20. The requirements for the strength of beam window 71 may vary as a function of design considerations for the detector or assembly 20, such as based on rigidity tolerances, allowable deflection, different operating pressures for gases within internal enclosure 110, different mechanical designs, dimensions, materials used, and other relevant considerations. In any event, the spacer panel 50 may further comprise a central opening 62 disposed completely through the spacer panel, the central opening 62 comprising a footprint larger than a footprint of the electrical interconnects 38 for one or more electronic devices 40 formed on the PCB substrate 30. The spacer panel 50 may be disposed over the upper first surface 32 of the PCB substrate 30.

The beam window assembly 20 further includes a beam window panel 70 comprising a rigid low-density foam core 72 comprising a first lower carbon fiber skin 74 disposed on a first surface 76 of the foam core 72 and a second upper carbon fiber skin 78 disposed on a second surface 80 of the foam core 72 opposite the first lower surface 76 of the foam core. The beam window panel 70 further comprises a beam window 71 formed on the first lower carbon fiber skin 74 of the beam window panel 70. In some instances, a metal conductive layer may be disposed over, on, or in direct contact with the beam window 71 to form a cathode 82. As such, the cathode 82 may be formed over or on the first lower carbon fiber skin 74 of the beam window panel 70. In some instances, the cathode 82 may be formed over the beam window 71, and in yet other instances, the cathode 82 may be formed on one or both (opposing) surfaces of the beam window panel 70.

The cathode 82 may be formed over the beam window 71 with an electrically conductive material such as a metal, including copper or other suitable material or metal. The conductive material may be applied as a conductive paint, foil, sticker, or layer of material that is applied by brush, roller, spray, laminate, adhesive, by sputter-coating, low-temperature sputter-coating, deposition, or other suitable process. In some instances, the sticker, such as a metal foil sticker, may be formed of Aluminum, AlBeMet, Copper foils, or other suitable material, and may comprise a thickness in a range of 2-100 µm, 2-20 µm, or 3-5 µm, and in some instances about 15 µm. Thin foil stickers have been found to be advantageously used when an area to be covered is less than or equal to approximately 20 cm². When an area to be covered has been greater than or equal to approximately 20 cm², thin foil stickers have been more difficult to apply, resulting in non-uniform surfaces with bubbles creating an uneven surface. When forming the cathode 82 with metallic paint, a primer, such as a liquid automotive primer may optionally be used, followed by planarizing the surface and then providing the conductive paint over the primer. Otherwise the conductive paint may be directly applied to a surface of the beam window panel 70. Examples of conductive paints include MG Chemicals 838AR, MG Chemicals 841AR, and MG Chemicals 843AR-340G.

A channel, recess, or separation 84 may be formed completely around a perimeter 86 of the cathode or beam window 82 with the channel 84 extending completely through the first lower carbon fiber skin 74 of the beam window panel 70.

The beam window panel 70 may further comprise the second upper carbon fiber skin 78 contacting or being coupled to a conductive ground ring 88 disposed over the second upper carbon fiber skin 78 and configured to electrically ground the second upper carbon fiber skin 78 of the beam window panel 70. The beam window panel 70 may be disposed over the PCB substrate 30 and over the spacer panel 50 with the cathode 82 aligned with the central opening 62 of the spacer panel 50 and oriented towards the upper first surface 32 of the PCB substrate 30. A thickness Ts of the skins, fiber skins, or carbon fiber skins 54, 58, 74, and 78 may be in a range of 0.1-0.4 mm, 0.2-0.3 mm, or about 2.5 mm. In some instances, such as when large cathode assemblies are formed (such as on the order of having a width W of 20 cm or more, or 30 cm or more) and additional rigidity is required, a solid metal flange may be used as a spacer, such as aluminum, steel, brass, or other suitable material. An amount of reinforcement, material strength, and housing construction may vary based on the application and the requirements for the window strength based on different assembly run pressures, different mechanical designs, and other features of the assembly 20.

The beam window assembly 20 may further include a pressure plate 90 disposed over the PCB substrate 30 with the spacer panel 50 and the beam window panel 70 disposed between the PCB substrate 30 and the pressure plate 90. The pressure plates 90, and any other pressure plates, may be formed of a material that is similar or identical to the skins 54, 58, 74, and 78, or to the cores 52, 72, or other suitable material. The pressure plates may be formed of carbon, carbon fiber, or other suitable material, and may be formed of woven carbon fiber plates comprising a thickness in a range of, or about, 1.5-3.5 mm, 2-3 mm, 2.2-2.7 mm, or 2.5 mm. The pressure plates may be made of a single unitary material, or multiple layer materials, and may be made without foam cores and without a layered "sandwich" design without a core.

The pressure plate 90 may further comprise a conductive layer 92 formed on a lower surface 94 of the pressure plate 90. The conductive layer 92 may be configured to be in electrical contact with the conductive ground ring 88 of the cathode pane 70. Furthermore, the pressure plate 90 may be coupled to the PCB substrate by any suitable chemical or mechanical fasteners, or both. In some instances, the pressure plate 90 may be coupled to the PCB substrate 30 with a plurality of mechanical fasteners 96 that extend through a plurality of fastener openings or holes 98 that couple together, and may extend through, the PCB substrate 30, the spacer panel 50, the beam window panel 70, and the pressure plate 90. Additionally, the beam window assembly 20 may further include a conductive spring or conductive interconnect 100 to provide electrically conductivity and grounding through the beam window assembly 20, as further shown and described with respect to FIGS. 4A-4D.

By providing the beam window assembly 20 as described herein, a beam window 71 for entry and exit of a beam 10 is provided that may be used with multiple detectors, imagers, and in various accelerator applications. Furthermore, in gas detectors, where it may be advantageous for the beam window 71 to be a cathode 82, as a dual-purpose structure, the same may be provided. Accordingly, the beam window assembly 20 may be advantageously used with parallel plate ionization chamber type detectors (i.e., when the ionization generated by radiation in the gas medium drifts in a magnetic field created between a cathode and an anode or another electrically biased structure) such as with micromegas mesh, a gas electron multiplier (GEM) foil, or Frisch grid of a time projection chamber.

By providing the beam window assembly 20 as described herein, a beam window 71 is provided that is rigid, comprises a large surface area for the beam entrance/exit and is largely transparent to radiation. While carbon fiber is relatively transparent to radiation and has been used in radiation detector applications, increasing a thickness of the carbon fiber for a desired rigidity or structural performance may increase thickness of the carbon fiber to a degree that its transparency to radiation becomes less than desirable.

By forming the beam window panel 70 and the beam window 71 with a composite or layered material comprising the rigid low-density foam core 72 bounded by the first lower carbon fiber skin 74 and the second upper carbon fiber skin 78 on opposing surfaces of the core 72, a number of advantages are obtained. First, the reduced skin thickness 74, 78 relative to a solid sheet of carbon fiber or fiber skin material is more transparent to ionizing radiation. Second, the beam window panel 70 may be formed with a very low-density material, such as on the order of 0.5 g/cc or less, or even 0.01 g/cc as noted above. As an example, a beam window panel 70 with 200 um skins and 2 mm foam core is about 30% more rigid than 3 mm solid carbon fiber sheet and is about 7 times more transparent to ionizing radiation than the 3 mm solid carbon fiber sheet. The same or similar advantages may also be achieved by spacer panel 50.

Figure 3A:
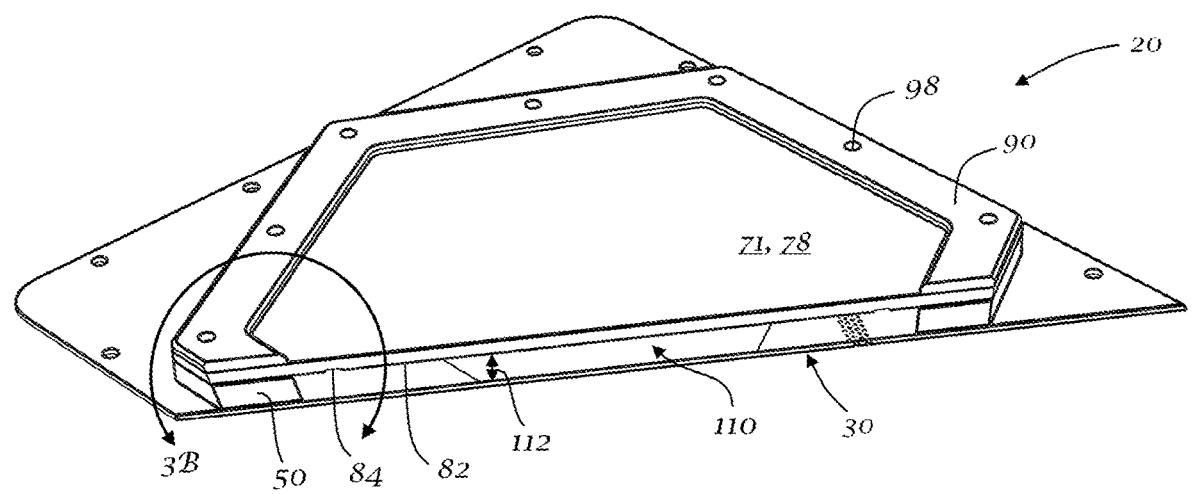
FIGS. 3A and 3B show various cross-sectional views of the beam window assembly shown in FIGS. 2A-2C.
Figure 3B:
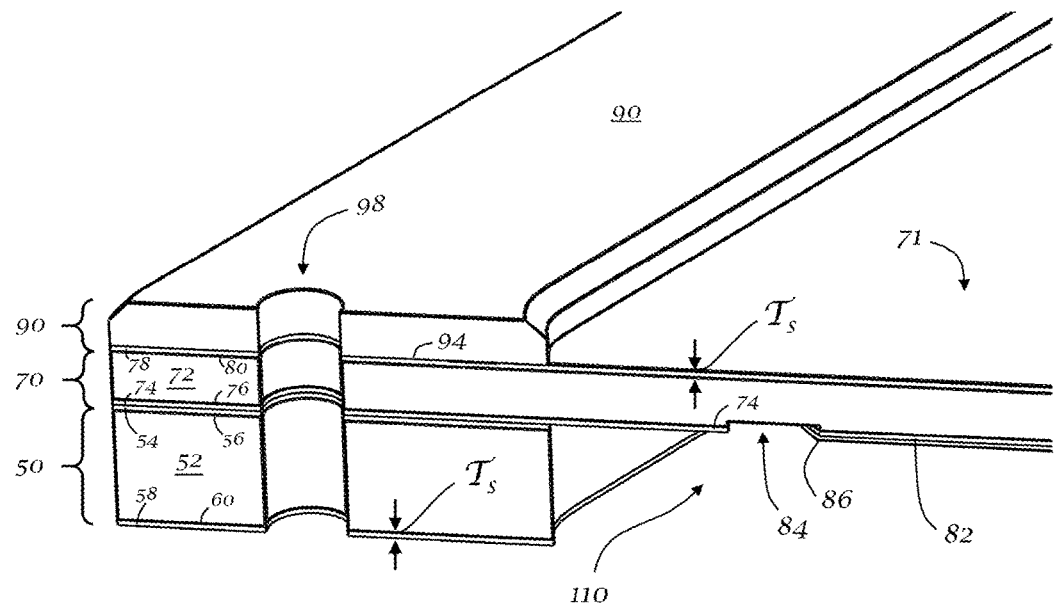

FIG. 2B shows a non-exploded perspective view of the beam window assembly 20, similar to the exploded view of the beam window assembly 20 shown in FIG. 2A, but in FIG. 2B the various layers or components of the beam window assembly 20, including the substrate 30, the spacer panel 50, the beam window panel 70, and the pressure plat 90, are coupled together and forming an internal disclosure 110, as further shown, e.g., in FIGS. 3A and 3B.

FIG. 2C shows a plan view of the underside of the beam window panel 70 as taken along the view line 2C shown in FIG. 2A. FIG. 2C shows the cathode 82 surrounded by the channel 84. The perimeter 86 of the cathode 82 as well as the channel 84 may comprise a hexagonal or generally hexagonal shape, as shown, as well as any other suitable or desired shape including rectangular, triangular, diamond, rectangle, rhombus, trapezoid, circle, oval, or any other suitable geometric or organic shape. The channel 84 may be formed completely around the perimeter 86 of the cathode 82, the channel 84 comprising a width of 3-7 mm, 4-6 mm, or about 5 mm that insulates against a voltage bias of at least 3 KV between the cathode 74 and the carbon fiber skin 74 of the beam window panel 70 separated that is from the cathode 74 by the channel 84. The shape of the perimeter 86 of the cathode 82 as well as the channel 84 may extend or vary so as to accommodate a nook, outlet, HV contact tab, or attachment point 83 that can receive or accommodate a high-voltage (HV) bias wire 85 or other suitable type of contact (for example, a POGO-pin type contact) for one or more of: (i) applying a desired electric potential to the cathode 82, (ii) providing or facilitating a desired electrical current or signals with the cathode 82, (iii) or both.

FIGS. 3A and 3B show various cross-sectional views of the beam window assembly shown in FIGS. 2A-2C. FIG. 3A, similar to FIG. 2B, shows a perspective view of the beam window assembly 20, and differs from FIG. 2B by showing a cross-sectional view of the beam window assembly 20 taken along section line 3A of FIG. 2B. FIG. 3B shows a close-up or enlarged perspective view of the portion of the beam window assembly 20 indicated by view line 3B in FIG. 3A. FIGS. 3A and 3B show the beam window assembly 20 may further include an internal enclosure 110 that is formed or bounded by the central opening 62 of the spacer panel 50, the upper first surface 32 of the PCB substrate 30, and the beam window panel 70. The internal enclosure 110 may be configured as an air field, a gas chamber, or a gas boundary that may be air-tight or hermetically sealed. Alternatively, the internal enclosure 110 may provide a space or offset 112 between the upper first surface 32 of the PCB substrate 30 (or the electronic devices 40 formed thereon), and the beam window panel 70, without forming an air-tight or hermetically sealed gas chamber or gas boundary. In instances when the internal enclosure 110 is not air-tight or hermetically sealed, the detector or beam window assembly 20 uses ambient air and need not be sealed to protect or contain a particular gas in a sealed chamber.

The mechanical stability of the PCB substrate 30, the spacer panel 50, the beam window panel 70, and the pressure plate 90 may limit vertical deformation, such as from bending, between the PCB substrate 30 and the cathode 82 or beam window panel 70 to less than 0.1%, so as to substantially maintain an offset between the PCB substrate 30 and the cathode 74. The rigid low-density panel design of the spacer panel 50 and the beam window panel 70 provide for a desirably rigid and light structure that limits deformation to maintain a set or fixed distance between the substrate 30—and the electronic devices 40 coupled thereto—and the cathode 82, the beam window panel 70, or both. In some instances, such as with the beam window assembly 20 comprising an overall width or diameter W of 25 cm, the vertical deformation between the substrate 30 and the cathode 82 will be less than or equal to 0.25 mm. The width W of the beam window assembly 20 may or may not include a larger width of the substrate 30.

Figure 4A:
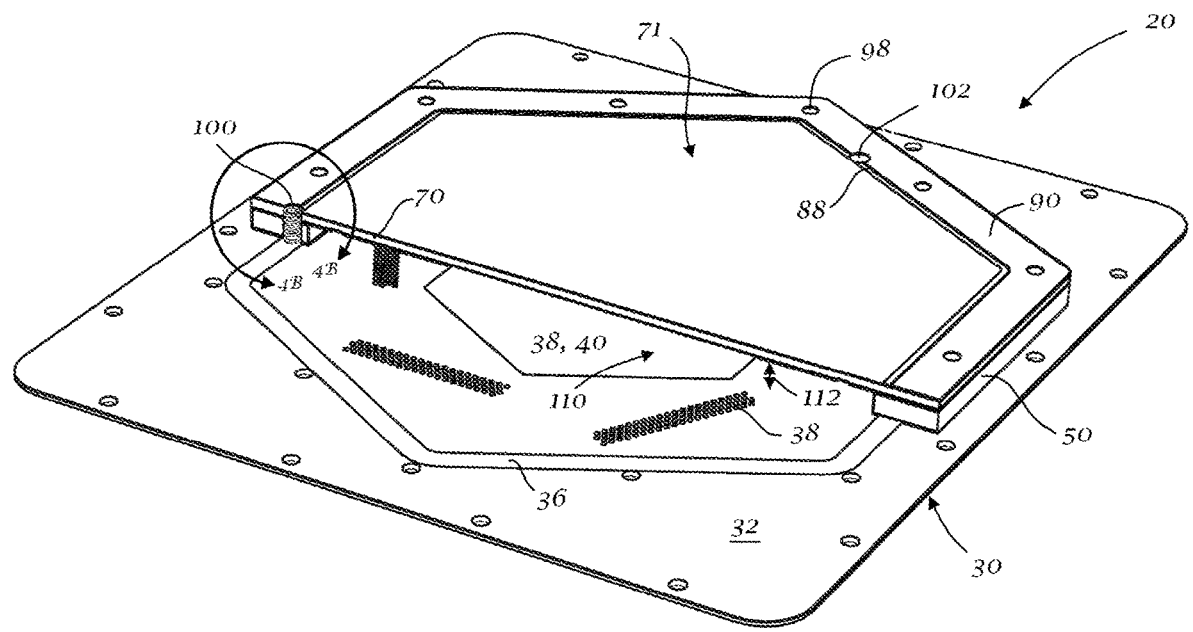
FIGS. 4A-4D show various cross-sectional views of the beam window assembly shown in FIGS. 2A-2C while further illustrating a spring or conductive interconnect.

FIGS. 4A-4D show various cross-sectional views of the beam window assembly shown in FIGS. 2A-2C while further illustrating a spring or conductive interconnect 100. FIG. 4A illustrates a perspective view with a partial cross-sectional view of the beam window assembly 20, similar to the view shown in FIG. 3A. FIG. 4A differs from FIG. 3A by showing the beam window assembly 20 may include a conductive spring or conductive interconnect 100 disposed in a conductive spring or conductive interconnect opening or hole 102 extending between, and coupled to, the electrical ground 36 of the upper first surface 32 of the PCB substrate 30 and the lower surface 94 of the pressure plate 90 such that the beam window panel 70 is grounded by, and electrically coupled through, the conductive layer 92 formed on the lower surface 94 of the pressure plate 90 and the conductive ground ring 88 of the second upper carbon fiber skin 78 of the beam window panel 70.

Figure 4B:
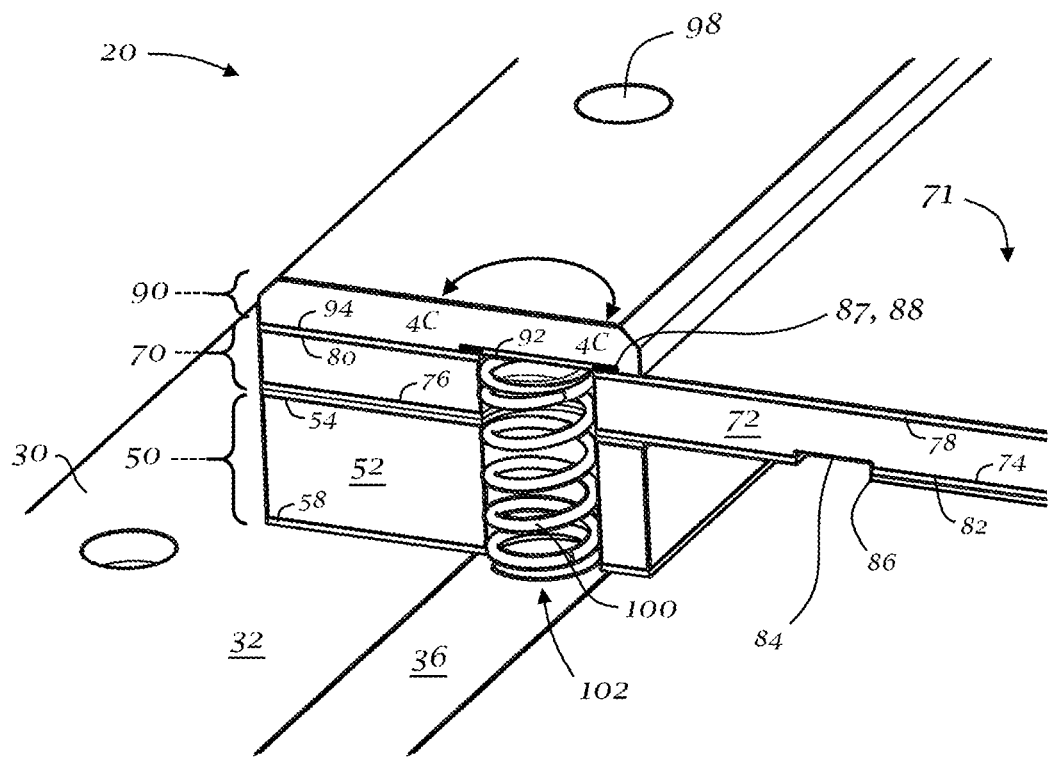

FIG. 4B illustrates a close-up or enlarged perspective view of the portion of the beam window assembly 20 shown by view line 4B in FIG. 4A, which includes additional detail of conductive spring or interconnect 100 disposed in the opening or hole 102.

Figure 4C:
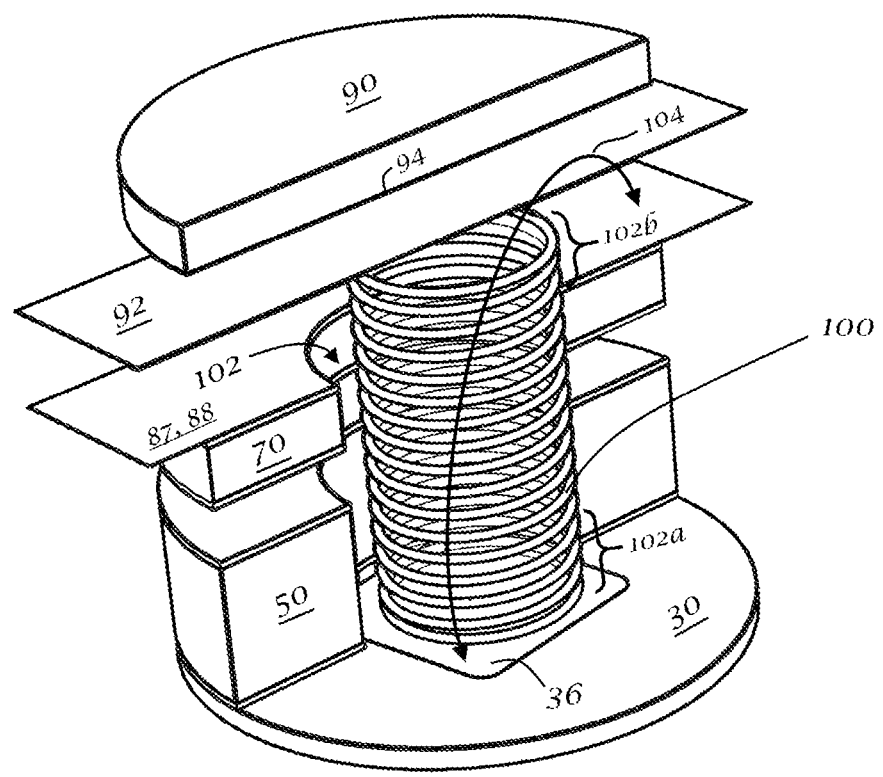

FIG. 4C illustrates a close-up or enlarged perspective view of the portion of the beam window assembly 20 shown by view line 4C in FIG. 4B, which includes additional detail of conductive spring or interconnect 100 disposed in the opening or hole 102. FIG. 4C provides an illustration of a structure that electrically grounds the second upper fiber skin 78 of the beam window panel 70. By electrically grounding the second upper fiber skin 78 of the beam window panel 70, the beam window assembly may be safely handled, and a handler may avoid an electrical shock, even when an electrical potential difference or voltage is applied to, or carried by, the cathode 82. In testing, a 6 KV was applied over a 7 mm air gap with the outside of the beam window assembly 20 being grounded and safe to handle. The portion of electrical ground 36 in contact with, or below, spring 100 may comprise a hexagonal or other desirable shape, as shown, e.g., in FIG. 2A. Similarly, the conductive ground ring 88, a portion of which is shown in FIGS. 4C and 5B, may also comprise a hexagonal shape (or other desirable shape), so as to match a shape or contour of all or part of one or more of the electrical ground 36, the cathode 82, the pressure plate 90, or other desired feature, and to provide for electrical connection through a common footprint and the vertical conductive interconnect 100. Arrow or path of electrical current 104 shows schematically how the grounding may occur for the beam window assembly 20, as further described with respect to FIG. 4D.

Figure 4D:
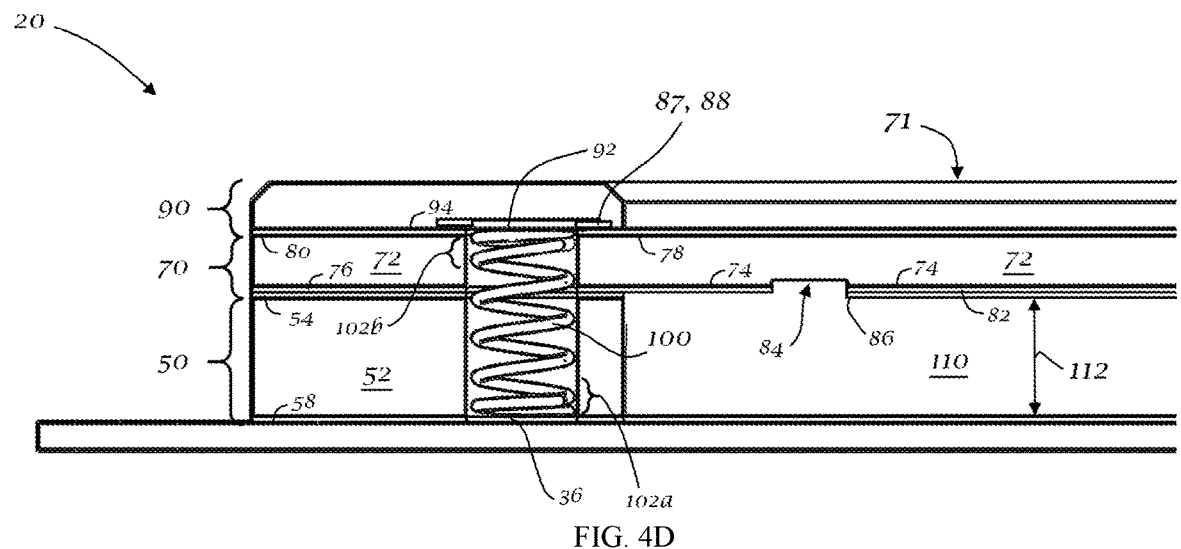

FIG. 4D illustrates a close-up or enlarged cross-sectional side view of a portion of the beam window assembly 20, which is similar to the portion of the beam window assembly 20 shown in the perspective view of FIG. 4B. Grounding of the second upper fiber skin 78 of the beam window panel 70 may be made to the electrical ground 36 on the substrate 30 by performing the following actions or creating the following structure. Configuring the conductive fiber or carbon fiber 79 within the second upper fiber skin 78 to make electrical contact by removing a portion of a coating material, such as epoxy, formed over or at epoxy surface 77 of the carbon fiber skin or sheet 78. Removal of a portion of the cover or epoxy surface 77 may be done by machining, milling, laser drilling, or other suitable process to expose fibers 79. The groove or channel 79 may then be metallized with conductive material 87, such as with conductive copper tape, to form the conductive ground ring 87, which may be positioned all around a perimeter of the second upper fiber skin 78. The lower surface 94 of the pressure plate 90 may comprise a matching or corresponding conductive layer or metallization layer 92 so that when the pressure plate 90 is coupled with the rest of the beam window assembly 20, the metallization layer 92 may mateably couple with, or contact, and be configured to electrically couple the conductive ground ring 88 to the conductive spring or interconnect 100 and to the electrical ground 36 through the conductive spring or interconnect 100.

Figure 5A:
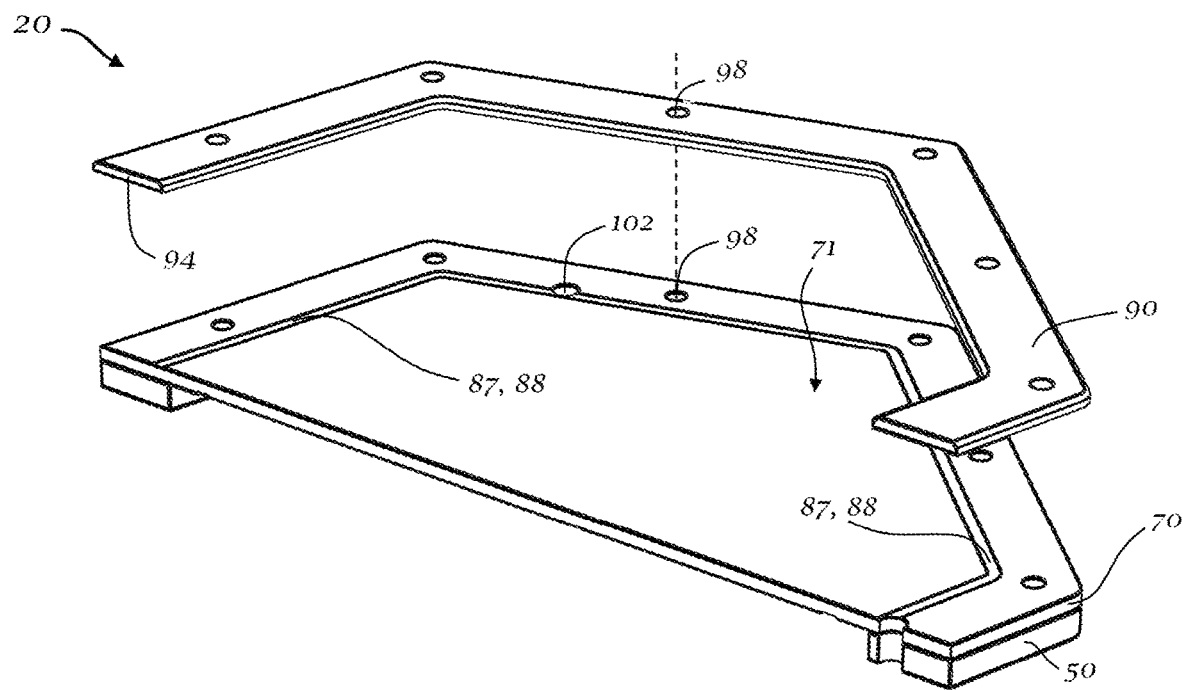
FIGS. 5A-5B show various views of a beam window panel of the beam window assembly.
Figure 5B:
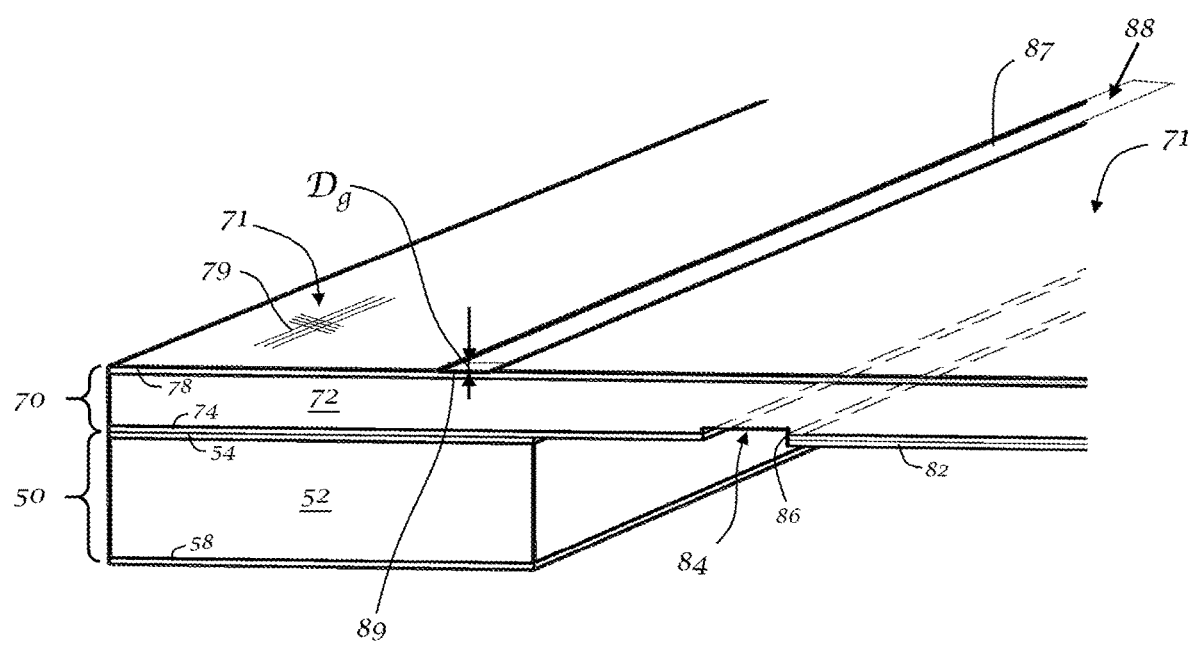

As shown in FIGS. 4A and 5A, the beam window panel 70 may be formed, configured, or arranged with at least one conductive spring or conductive interconnect opening or hole 102 that may be adjacent, or pass through all or part of, the conductive ground ring 88. Each conductive interconnect opening 102 is sized or configured to receive a conductive spring or conductive interconnect 100 that may contact the electrical ground on the PCB 30 with a first or lower end 100a of the conductive interconnect 100 on the bottom against surface ground pads, and a second or upper end 100b of the conductive interconnect 100 against conductive layer or metallization 92 on the inside or lower surface 94 of the pressure plate 90.

FIGS. 5A and 5B illustrate various views of the beam window panel 70 comprising conductive ground ring 88 disposed over spacer panel 50. FIG. 5A further shows the pressure plat 90 disposed over the beam window panel 70 in an exploded view with portions of the fastener openings or holes 98 aligned with each other and configured for receiving mechanical fasteners 96 for coupling together the beam window assembly 20.

FIG. 5B illustrates how the conductive ground ring 88 may be formed with a conductive material 87 such as a conductive sticky copper tape disposed in a groove or channel 89. The groove 89 may be formed with a hexagonal or other suitable shape as shown, while other desired shapes may also be used. A footprint of the groove 89 may be completely or partially coincident with a footprint of the electrical ground 36. The groove 89 may comprise a depth Dg greater than 15 micrometers (μm), about 20 μm, or other depth that extends completely through an epoxy surface 77. A width of the groove 89 (measured in a direction perpendicular or orthogonal to the depth Dg) may be similar or equal to the depth Dg of the groove 89. The epoxy surface or sealant surface 77 may be disposed over the carbon fiber 79 of the second upper carbon fiber skin 78, so as to protect and isolate the carbon fiber skin 78. By forming groove 89 and exposing fiber 79, the conductive ground ring 88 may be in electrical contact with the carbon fiber 79 of the second upper carbon fiber skin 78. The above may be useful in providing a beam window assembly 20 that is electrically grounded to achieve one or more of the following: (i) prevent shocks to users, and (ii) transfer the electric potential and/or current to other functional parts of a detector assembly 20; particularly as carbon fiber skins 54, 58, 74, and 78 are conductive but conductivity is non-isotropic, i.e. individual fibers 79 are electrically conductive and electricity generally conducts only along the directions of the weave wires.

By forming and using the beam window assembly 20 as described herein, a number of advantages are present. First, carbon fiber skins used for the composite panels may be formed with one or more layers, strata, or lamina of carbon fibers nested or encompassed within binder, glue, or adhesive, such as an epoxy material. A result may be epoxy rigid sheet material comprising laminations of carbon in an epoxy matrix that are very rigid and can be made very thin (0.01 inches (in.) and thinner) while still providing the desired function. The resulting carbon fiber skins are very transparent to radiation beams 10 and to ionizing radiation, allowing the beam window assembly 20 to receive and process signals without unwanted interference. Furthermore, the carbon fiber sheets, in addition to serving as a window for a radiation beam 10, may also serve an additional purpose as cathodes 82 (being biased to create an electrical potential difference in ionization detectors to work).

Furthermore, while very thin carbon fiber sheets may operate well as small beam windows, with larger areas of the windows (such larger windows as on the order of several inches (e.g. 2-3 in.) to several feet across) the thin carbon sheets become flexible and windows of larger size have difficulty maintaining sufficient mechanical rigidity. By using composite panels with skins or thin planar covers, such as carbon fiber sheet windows, sandwiched around an intermediate core material, such as foam a clear window to radiation may be maintained, while improving structural support, including rigidity, light weight, and machinability, while also providing sound, vibration, and thermal insulation. Construction with the robust panel design allows for physical contact and rough treatment, including dynamically loading and impacts.

Conventionally, flexible materials for radiation beam entry windows have had limited applicability, and have not been used as cathodes as the shape of the flexible material flexes and fails to maintain constant and uniform electric field strength inside the detector working volume. To the contrary, the beam window assembly 20 is able to maintain uniform and constant electric field strength due to its rigid structure, even with relatively large radiation windows, such as on the order of 2-3 inches up to several feet across or more.

The composite panels allow for, facilitate, and provide, for beam windows 71 and cathodes 82, and methods for making the same, that are on the order of tens of inches across, such as 10 in., 20 in., 30 in., 40 in., or more. For example, a window in a device for medical applications may desirably be on the order of 30-50 cm, or about 40 cm, such as 43 cm (17 inches). In such instances, the stability of maintaining mechanical shape is better than 0.1%, significantly reducing bending and different offsets in distance between the radiation window 71 and the PCB 30 and devices or sensors coupled thereto. The stability in mechanical shape, including maintaining a fixed or constant offset between the cathode 83 and the PCB 30 extends to large window sizes, such as several feet across, including up to 3, 4, 5, and 6 feet across, or more that may, for example, be used in cargo monitoring and security screening applications.

With the support of a very low-density and yet very rigid foam core, and the skins on either side of the core (such as carbon skins comprising a thickness in a range of 0.1 mm-5 mm), the overall thickness of the beam window assembly 20 as disclosed with respect to penetration by ionizing radiation beam 10 can be very small. Suitable core material may have an extremely low density given and a corresponding a very low water equivalent, which allows for improved functioning, capturing, and reduced interference with the radiation beam 10. The core also provides for offset between the skins, which improves structural strength with an increased capacity to support bending moments.

More specifically, a water equivalency of a 7 mm foam core panel with 0.012" thick carbon fiber skins on both sides, will have a water equivalent thickness of about 1.5 mm. Using the design described herein, total water equivalent thickness of the detector with respect to the ionizing radiation beam 10 can be roughly estimated to be equal to 6 mm of water. As an example, a beam window made of just a rigid carbon fiber sheet will have to be on the order or, or about, 2.5 mm thick, which will have water thickness equivalent of about twice its thickness, i.e. 5 mm. Thus, the present design of a beam window assembly 20 using composite panels comprising skins, like carbon fiber with a foam core, will improve over a solid 2.5 mm carbon fiber sheet by a factor of about three. Additionally, while decreasing water equivalency and improving "visibility" to radiation beam 10, the foam core beam window 71 disclosed is also more structurally sound and more rigid, being more than ten times more rigid than a 2.5 mm single carbon fiber sheet window.

The ability to create very large-area and very rigid beam windows together with the way an electrical bias potential is applied to the composite panel such that at least a portion of the panel becomes or acts as a cathode has been unknown, and allows for the same panel/window inside as cathode for parallel plate ionization detectors such as beam window assembly 20. The beam window/cathode may also be formed air tight or gas tight, to allow for different types of testing and gas environments. As such, the beam window assembly 20 disclosed herein provides novel and widely applicable and versatile technology that may provide advantages to, and be applicable with, a wide array of industry and scientific devices, such as detectors for military application, security applications, POE screenings, medical devices, radiation metrology, and other similar or related applications.

While this disclosure includes a number of embodiments in different forms, the drawings and written descriptions herein are presented with respect to the particular embodiments herein are presented with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other manufacturing devices and examples could be intermixed or substituted with those provided. In places where the description refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

What is claimed is:

1. A radiation beam window assembly, comprising:
   a printed circuit board (PCB) substrate comprising an upper first surface comprising a power array comprising an electrical ground, and electrical interconnects for one or more electronic devices selected from the group consisting of pressure sensors, temperature sensors, data acquisition devices, and communication devices;
   a spacer panel comprising a rigid low-density foam core comprising a first carbon fiber skin disposed on a first surface of the foam core and a second carbon fiber skin disposed on a second surface of the foam core opposite the first surface of the foam core, the spacer panel further comprising:
      a central opening disposed completely through the spacer panel, the central opening comprising a footprint larger than a footprint of the electrical interconnects for one or more electronic devices formed on the PCB substrate, and
      wherein the spacer panel is disposed over the upper first surface of the PCB substrate;
   a beam window panel comprising a rigid low-density foam core comprising a first lower carbon fiber skin disposed on a first surface of the foam core and a second upper carbon fiber skin disposed on a second surface of the foam core opposite the first lower surface of the foam core, the beam window panel further comprising:
  a cathode formed on the first lower carbon fiber skin of the beam window panel as a conductive paint, foil, or sticker,
  a channel formed completely around a perimeter of the cathode with the channel extending completely through the first lower carbon fiber skin of the beam window panel,
  the second upper carbon fiber skin coupled to a conductive ground ring disposed over the second upper carbon fiber skin and configured to electrically ground the second upper carbon fiber skin of the beam window panel, and
  wherein the beam window panel is disposed over the PCB substrate and over the spacer panel with the cathode aligned with the central opening of the spacer panel and oriented towards the upper first surface of the PCB substrate;
a pressure plate disposed over the PCB substrate with the spacer panel and the beam window panel disposed between the PCB substrate and the pressure plate, the pressure plate further comprising:
  a conductive layer formed on a lower surface of the pressure plate, the conductive layer configured to be in electrical contact with the conductive ground ring of the beam window panel, and
  wherein the pressure plate is coupled to the PCB substrate with a plurality of mechanical fasteners that extend through the PCB substrate, the spacer panel, the beam window panel, and the pressure plate; and
a conductive spring extending between and coupled to the electrical ground of the upper first surface of the PCB substrate and the lower surface of the pressure plate such that the beam window panel is grounded by, and electrically coupled through, the conductive layer formed on the lower surface of the pressure plate and the conductive ground ring of the second upper carbon fiber skin of the beam window panel.

2. The radiation beam window assembly of claim 1, wherein the central opening of the spacer panel is bounded by the PCB substrate and the beam window panel to form an internal enclosure, the internal enclosure configures as an air field, a gas chamber, or a gas boundary.

3. The radiation beam window assembly of claim 1, wherein the mechanical stability of the PCB substrate, the spacer panel, the beam window panel, and the pressure plate limit vertical deformation from bending between the PCB substrate and the cathode to less than 0.1%, to substantially maintain an offset between the PCB substrate and the cathode.

4. The radiation beam window assembly of claim 1, wherein the carbon fiber skins of the spacer panel and the beam window panel comprise a thickness in a range of 0.2-0.8 mm.

5. The radiation beam window assembly of claim 1, wherein the channel formed completely around a perimeter of the cathode comprises a width of 4-6 mm and insulates against a voltage bias of at least 3 KV between the cathode and the carbon fiber skin of the beam window panel separated from the cathode by the channel.

6. The radiation beam window assembly of claim 1, wherein the conductive ground ring is formed with a conductive sticky copper tape disposed in a hexagonal groove comprising a depth greater than 15 micrometers that extends completely through an epoxy surface disposed over the carbon fiber of the second upper carbon fiber skin such that the conductive ground ring is in electrical contact with the carbon fiber of the second upper carbon fiber skin.

7. A radiation beam window assembly, comprising:
  a substrate comprising a first surface comprising electrical interconnects for one or more electronic devices;
  a spacer panel comprising a central opening disposed completely through the spacer panel and disposed over the first surface of the substrate;
  a beam window panel comprising a foam core comprising a first fiber skin disposed on a first surface of the foam core and a second fiber skin disposed opposite the first surface, the beam window panel further comprising:
    a cathode formed over the first fiber skin and aligned with the central opening of the spacer panel and the first surface of the substrate,
    a channel formed completely around a perimeter of the cathode with the channel extending completely through the first fiber skin of the beam window panel, and
    the second fiber skin comprising a ground ring configured to be electrically grounded; and
  a pressure plate disposed over the beam window panel and mechanically coupled to the substrate, the pressure plate comprising a conductive layer configured to be electrically grounded with the ground ring.

8. The radiation beam window assembly of claim 7, further comprising a conductive spring comprising a first end coupled to the first surface of the substrate and a second end coupled to the pressure plate such that the beam window panel is grounded by, and electrically coupled through, the conductive spring.

9. The radiation beam window assembly of claim 7, wherein the spacer panel further comprises a foam core comprising a first fiber skin disposed on a first surface of the foam core and a second fiber skin disposed opposite the first surface of the foam core.

10. The radiation beam window assembly of claim 7, wherein the spacer panel comprises a solid metal flange.

11. The radiation beam window assembly of claim 7, wherein the fiber skins of the spacer panel and the beam window panel comprise a thickness in a range of 0.2-0.3 mm.

12. The radiation beam window assembly of claim 7, wherein the channel formed completely around a perimeter of the cathode comprises a width of 4-6 mm and insulates against a voltage bias of at least 3 KV between the cathode and the fiber skin of the beam window assembly separated from the cathode by the channel.

13. The radiation beam window assembly of claim 7, wherein the conductive ground ring is formed with a conductive material disposed in a groove that extends completely through an epoxy surface disposed over the fiber of the second fiber skin such that the conductive ground ring is in electrical contact with the fiber of the second fiber skin.

14. A radiation beam window assembly, comprising:
  a substrate comprising a first surface configured to receive one or more electronic devices; and
  a beam window panel comprising a core, a first skin disposed on a first surface of the core, and a second skin disposed opposite the first surface, the beam window panel further comprising:
    a beam window,
    a channel formed completely around a perimeter of the beam window with the channel extending completely through the first skin of the beam window panel, and a ground ring configured to be electrically grounded and to electrically isolate the second skin of the beam window panel from the beam window.

15. The radiation beam window assembly of claim 14, further comprising a spacer panel comprising a core, a first fiber skin disposed on a first surface of the foam core, and a second fiber skin disposed opposite the first surface of the foam core, the spacer panel further comprising a central opening disposed completely through the spacer panel and positioned over the first surface of the substrate.

16. The radiation beam window assembly of claim 15, further comprising a cathode formed over the first skin of the beam window panel and aligned with the first surface of the substrate.

17. The radiation beam window assembly of claim 16, further comprising a conductive interconnect comprising a first end coupled to the first surface of the substrate and a second end configured to be electrically coupled to the cathode to electrically ground the substrate and the second skin of the beam window panel from the cathode.

18. The radiation beam window assembly of claim 16, wherein the channel formed completely around a perimeter of the cathode comprises a width of 2-8 mm and insulates against a voltage bias of at least 3 KV between the cathode and the first skin of the beam window assembly separated from the cathode by the channel.

19. The radiation beam window assembly of claim 14, further comprising:
   a pressure plate disposed over the beam window panel and mechanically coupled to the substrate, the pressure plate comprising a conductive layer configured to be electrically grounded with the conductive interconnect; and
   wherein the substrate, spacer panel, beam window panel, and pressure plate are coupled with a plurality of mechanical fasteners.

20. The radiation beam window assembly of claim 14, wherein the conductive ground ring is formed with a conductive material disposed in a groove that extends completely through an epoxy surface disposed over a conductive portion of the second skin such that the conductive ground ring is in electrical contact with the conductive portion of the second skin.

* * * * *